United States Patent
Terada et al.

(10) Patent No.: US 7,524,893 B2
(45) Date of Patent: Apr. 28, 2009

(54) CONDUCTIVE ADHESIVE

(75) Inventors: Nobuto Terada, Tsukuba (JP); Naoto Shioi, Tsukuba (JP); Masashi Totokawa, Kariya (JP); Yasunori Ninomiya, Kariya (JP)

(73) Assignees: Harima Chemicals, Inc., Hyogo (JP); Denso Corporation, Aichi (JP)

( * ) Notice: Subject to any disclaimer, the term of this patent is extended or adjusted under 35 U.S.C. 154(b) by 85 days.

(21) Appl. No.: 10/597,937

(22) PCT Filed: Feb. 9, 2005

(86) PCT No.: PCT/JP2005/001941

§ 371 (c)(1),
(2), (4) Date: Sep. 27, 2006

(87) PCT Pub. No.: WO2005/078034

PCT Pub. Date: Aug. 25, 2005

(65) Prior Publication Data

US 2007/0185243 A1   Aug. 9, 2007

(30) Foreign Application Priority Data

Feb. 13, 2004  (JP) .............................. 2004-036213

(51) Int. Cl.
   *C08K 5/04*   (2006.01)
(52) U.S. Cl. .................. 523/457; 252/512; 252/514
(58) Field of Classification Search ............. 523/457
   See application file for complete search history.

(56) References Cited

U.S. PATENT DOCUMENTS

| | | | | |
|---|---|---|---|---|
| 4,557,860 A * | 12/1985 | DiSalvo et al. | ............... | 252/512 |
| 4,696,764 A | 9/1987 | Yamazaki | | |
| 5,156,771 A * | 10/1992 | Yamamoto et al. | ........... | 252/512 |
| 5,334,662 A * | 8/1994 | Ochi et al. | ..................... | 525/90 |
| 5,914,358 A * | 6/1999 | Kawakita et al. | ............. | 523/458 |
| 5,939,509 A * | 8/1999 | Hirano et al. | ................. | 528/101 |
| 6,420,464 B1 * | 7/2002 | Kuboki et al. | ................. | 524/109 |
| 2002/0043728 A1* | 4/2002 | Harada | ........................ | 257/787 |
| 2002/0061971 A1* | 5/2002 | Yamaguchi et al. | .......... | 525/107 |
| 2002/0117259 A1* | 8/2002 | Giroux et al. | ................ | 156/330 |
| 2005/0287363 A1 | 12/2005 | Ring et al. | | |
| 2005/0288436 A1 | 12/2005 | Ring et al. | | |
| 2005/0288437 A1 | 12/2005 | Ring et al. | | |

FOREIGN PATENT DOCUMENTS

| | | |
|---|---|---|
| DE | 24 46 658 | 4/1975 |
| DE | 34 43 789 A1 | 6/1985 |
| DE | 35 86 372 T 2 | 3/1993 |
| DE | 102004031188 A1 | 1/2006 |
| DE | 102004031189 A1 | 1/2006 |
| DE | 102004031190 A1 | 1/2006 |
| EP | 0 171 157 B1 | 7/1992 |
| JP | 5-121465 | 5/1993 |
| JP | 7-90238 | 4/1995 |
| JP | 7-90239 | 4/1995 |
| JP | 9-53001 | 2/1997 |
| JP | 9-143445 | 6/1997 |
| JP | 10-30082 | 2/1998 |
| JP | 11-228925 | 8/1999 |
| JP | 2000-192000 A | 7/2000 |
| JP | 2000-290617 A | 10/2000 |
| JP | 2003-45228 A | 2/2003 |
| JP | 2003-147306 A | 5/2003 |

OTHER PUBLICATIONS

Pham, Ha Q.; Marks, Maurice J. "Epoxy Resins" Jul. 15, 2004. Encyclopedia of Polymer Science and Technology. John Wiley and Sons.*
Machine Translation of JP 07-090238.*
Machine Translation of JP 10-030082.*

* cited by examiner

*Primary Examiner*—Mark Eashoo
*Assistant Examiner*—Megan McCulley
(74) *Attorney, Agent, or Firm*—Knobbe Martens Olson & Bear LLP

(57) ABSTRACT

The present invention provides a conductive adhesive that is applicable as means for forming conductive junction to process for surface mounting of electronic parts for vehicle loading and process for the manufacture of the electronic parts per se for the purpose of substituting soldering therewith. The conductive adhesive according to the present invention is a conductive adhesive produced by dispersing a conductive medium, such as silver powder, in a binder resin component of a one-component epoxy thermosetting resin which has such a composition that the resin comprises, as essential components, an epoxy resin component composed mainly of an epoxy compound with a polycyclic aromatic ring skeleton, and a cyclic acid anhydride as a curing agent component thereof, and is further added with a coupling agent as an adherence imparting agent therefor.

13 Claims, No Drawings

CONDUCTIVE ADHESIVE

This application is the U.S. National Phase under 35 U.S.C. §371 of International Application PCT/JP2005/001941, filed Feb. 9, 2005, which claims priority to Japanese Patent Application No. 2004-036213, filed Feb. 13, 2004. The International Application was not published under PCT Article 21(2) in English.

1. Technical Field

The present invention relates a paste-like conductive adhesive using metal powder as a conductive medium, and profitably employing epoxy thermosetting resin as a binder thereof; more specifically to a conductive adhesive that is applicable to provide conductive junction in mounting of electronic parts in place of soldering.

2. Background Art

In the process for assembling electronic devices or mounting electronic parts, as means for achieving conductive junction between circuit wiring and individual electronic parts, soldering is widely used. In recent years, use of lead-free solder containing no lead as a material for soldering has been promoted, and as for lead-free solder using tin as the mother material, the lowering of melting temperature to about 180° C. has been achieved. However, the melting temperature of the lead-free solder using tin as the mother material is still higher than the melting temperature of conventional Sn—Pb eutectic solder by 20° C. or more, and thus in the solder joining/reflow processing temperature in the mounting step, there remains still somewhat fear that it would cause unnecessary damage by heat to electronic parts. From such a point of view, the use of conductive adhesives in place of soldering has been examined in the wider range of conductive junction for mounting electronic parts.

In addition, with the downsizing and high-density mounting of electronic parts to be joined, the area of the joint has been proportionally narrowed, and to joining performance in the joint using the conductive adhesive, low contact resistance and high adhesive strength has been demanded. On the other hand, regarding the substituting use in the field employing cream solder, the conductive adhesive itself can be applied by mask printing utilizing the fluidity thereof, and for instance, it is the most useful means in low-temperature mounting for surface mounting downsized electronic parts on the substrate circuit or the like wherein the heating process temperature is set at 180° C. or lower. Particularly in soldering, the use of solder flux is essential to achieve favorable joining, and cleaning and removal of solder flux remaining in the joint after forming the joint is required, but in joining using the conductive adhesive, no cleaning and removal of such flux is naturally required. In view of this advantage, the conductive adhesive is the most useful means in the application to low-temperature mounting for the surface mounting of electronic parts in high density.

Further, many electronic devices on which these electronic parts are mounted are installed in motor vehicles, and in-vehicle electronic devices, modules and the like must secure sufficient reliability even under conditions exposed to a high-temperature for a long time, for example, in the environment close to the room for engine. When conductive joining using the conductive adhesive is employed for mounting electronic parts in the in-vehicle electronic devices and modules, the exertion of high joining reliability in high-temperature environment of at least 150° C. for a long time is required. Similarly, when the electrical joints of the electric parts to the substrate circuit is exposed to high-temperature, high-humidity conditions, the elevation of contact resistance or lowering of connection strength due to the formation of metal oxides in the joining interface by the effect of humidity (moisture) invading from such an environment is also the factor for lowering the long-term reliability of in-vehicle electronic devices and modules. For example, in the case of soldering, such a technique for performing the treatment to prevent the invasion of moisture by filling with an under-filler is used. In similar, in such a case that the conductive joints using such a conductive adhesive are exposed to high-temperature, high-humidity conditions of, for instance, 85° C. and 85% RH, it is also desired that the elevation of contact resistance or lowering of adhesive strength due to the formation of metal oxides in the joining interface by the effect of humidity (moisture) invading from such an environment can be suppressed and that high joining reliability is exerted. Furthermore, since motor vehicles themselves equipped with in-vehicle electronic devices and modules are placed outdoor, with change in outdoor temperatures in day and night, and difference in outdoor temperatures between summer and winter, long-term reliability also against cyclic temperature change for a long period of time is required. Therefore, when the conductive joints using the conductive adhesive is used in the in-vehicle electronic devices and modules, it is desired to suppress the elevation of contact resistance or lowering of connecting strength and to exert high joining reliability even in the cooling-heating temperature cycle environment.

Heretofore, there has already been proposed a conductive adhesive that is excellent in crack resistance, in which, when the conductive joints using a conductive adhesive is used, the binder resin component showing reduced water absorption is employed to suppress the lowering of adhesive strength due to water absorption is suppressed, and also to suppresses the occurrence of fine cracks in the binder resin due to high-temperature treatment in thereafter performed other soldering process. For example, for the purpose of suppressing water absorption by the binder resin component as well as lowering of adhesive strength due to the water absorption, in addition to the aim of high cracking resistance, there has been reported a conductive paste (conductive adhesive) utilizing, as a binder resin component, such a one-component epoxy resin that comprises an epoxy compound having a naphthalene skeleton; and a phenol curing agent, such as a phenol novolak resin, or an amine curing agent, such as amide compounds and amine compounds, including polyamide, polyamine, and dicyandiamine as a latent curing agent for the epoxy compound (refer to Japanese Patent Laid-Open Nos. 7-90238 and 7-90239).

DISCLOSURE OF THE INVENTION

As described above, as for the conductive adhesive, in particular, the paste-like conductive adhesive using metal powder as a conductive medium and employing an epoxy thermosetting resin as the binder thereof, as the epoxy thermosetting resin itself used therein is the resin exhibiting a high adhesive strength, although its bonding strength in the vicinity of room temperature is slightly inferior to the bonding strength using conventional Sn—Pb eutectic solder, it has sufficiently reached the practical level. The volume resistivity of the obtained cured conductive product itself is significantly higher than the volume resistivity of conventional Sn—Pb eutectic solder itself, however, it has sufficiently reached the practical level as long as the contact resistance of the obtained joints is considered. Thus, it can be used as means for conductive joining, in place of soldering, at least in the field where no repairing ability to removing once joined electronic parts again is required. In such a case, when it is used as means for mounting electronic parts on the surface of the substrate circuit or the like or as means for forming conductive joints in fabricating electronic parts themselves intended for in-vehicle electronic devices and modules, the bonding performance thereof is required to satisfy all of long-term reliability in high-temperature environment of at least 150° C., long-term reliability in high-temperature, high-humidity condition, and long-term reliability in cooling-heating temperature cycle environment.

The present invention solves said problems, and an aim of the present invention is to provide a conductive adhesive that can be used as means for mounting electronic parts on the surface of a substrate circuit or the like, or means to form conductive joints in fabricating the electronic parts themselves intended for in-vehicle electronic devices, modules and the like; and in particular, a paste-like conductive adhesive employing an epoxy thermosetting resin that is excellent in long-term reliability in a high-temperature environment of at least 150° C., long-term reliability in high-temperature, high-humidity condition, and long-term reliability in cooling-heating temperature cycle environment.

The present inventors studied diligently to solve the above-described problems, and arrived at the following finding such that if such a composition that a one-component epoxy thermosetting resin composition was utilized as a binder resin component for metal powder used as a conductive medium, such as silver powder was chosen for a conductive adhesive, wherein, in the one-component epoxy thermosetting resin composition, an epoxy resin component comprising at least a multifunctional epoxy compound having a polycyclic aromatic ring skeleton as a main component therein and a cyclic acid anhydride having an acid anhydride moiety composing a ring structure in the molecule as the curing agent therefor were employed as an essential component thereof, the glass transition temperature of the epoxy thermosetting resin itself to be the binder resin in the obtained cured conductive product could be 140° C. or higher, and in addition, even in high-temperature, high-humidity environment, both the invasion of water into the jointing interface between the metal surface and the cured conductive product to be joined and the water absorption of the binder resin itself could be suppressed to an extremely low level, as a result, a conductive joints that were excellent in long-term reliability under high-temperature environment of at least 150° C. and long-term reliability under a high-temperature, high humidity condition could be formed thereby. In such a case, it was also confirmed that if the resin composition is a liquid composition comprising the cyclic acid anhydride curing agent in the ratio within the range close to one equivalent per epoxy equivalent of the epoxy resin component, and optionally being added with an adherence imparting agent, such as a silane coupling agent if desired, joining performance between the metal surface and the cured conductive product that further excels in long-term reliability in a cooling-heating temperature cycle environment could be easily attained in addition to the above-described excellent adherence properties in the high-temperature environment and under a high-temperature, high-humidity condition. On the basis of these series of findings, the present inventors completed the present invention.

Specifically, the conductive adhesive according to the present invention is:

a conductive adhesive comprising metal powder as a conductive medium and a one-component epoxy thermosetting resin composition as a binder resin component, wherein the metal powder is silver powder or mixed metal powder comprising silver powder mixed with a small quantity of other metal powder, the one-component epoxy thermosetting resin composition is a liquid composition comprising, as essential components:

(a) an epoxy resin component containing at least a multifunctional epoxy compound having a polycyclic aromatic ring skeleton as a main component therein, and (b) a cyclic acid anhydride having an acid anhydride moiety constituting a ring structure in the molecule as a curing agent, in a ratio of 0.7 to 1.1 equivalents of the cyclic acid anhydride of the curing agent (b) with respect to the epoxy equivalent of the epoxy resin component (a), the adhesive is a dispersion in which the metal powder is dispersed in said one-component epoxy thermosetting resin composition with a content ratio of the metal powder to the binder resin component (metal:resin volume ratio) being selected within a range between 30:70 and 64:36. In such a case, as required, to the one-component epoxy thermosetting resin composition, a coupling agent may be added as an adherence imparting agent. For example, as the coupling agent, a silane coupling agent may be added, and is generally preferable.

In the conductive adhesive according to the present invention, at least, a bifunctional epoxy compound containing a naphthalene skeleton is preferably comprised as one of said multifunctional epoxy compounds having a polycyclic aromatic ring skeleton that is a main component of the epoxy resin component (a). For example, it is more preferable to select such a composition comprising at least dihydroxynaphthalene diglycidylether as the bifunctional epoxy compound containing naphthalene skeleton.

Further in the conductive adhesive according to the present invention, it is preferred that, to said one-component epoxy thermosetting resin composition, (c) a cure accelerator having a function to accelerate heat curing reaction by the cyclic acid anhydride of the curing agent (b) is further added, and the amount of the cure accelerator (c) to be added thereto is selected to be within the range of a catalytic quantity to said epoxy resin component (a).

On the other hand, as the cyclic acid anhydride of the curing agent (b), it is preferable to employ a cyclic acid anhydride, wherein the ring structure constituted by the acid anhydride moiety is a 5-member or 6-member ring, and another hydrocarbon ring skeleton is condensed with the ring structure constituted by the acid anhydride moiety; and the hydrocarbon ring skeleton is a hydrocarbon ring skeleton having a total number of carbon atoms of 8 or more, having two or more chain-like hydrocarbon substituent group, or having a bridged chain on the ring.

Furthermore, said one-component epoxy thermosetting resin composition may also have a composition wherein said epoxy resin component (a) comprises a multifunctional epoxy compound having another ring structure in the skeleton, in addition to the multifunctional epoxy compound having a polycyclic aromatic ring skeleton, which is the main component thereof, and the blending ratio of the multifunctional epoxy compound having the another ring structure in the skeleton to 100 parts by mass of the multifunctional epoxy compound having the polycyclic aromatic ring skeleton is selected to be within the range between 5 and 50 parts by mass.

On the other hand, it is preferable that said metal powder is silver powder or mixed metal powder formed by mixing a small quantity of other metal powder to silver powder, and the ratio of the silver powder to the entire metal powder is selected to be at least within the range of 70% or more in a volume ratio.

In the conductive adhesive according to the present invention, as for the one-component epoxy thermosetting resin used as the binder resin, a cyclic acid anhydride is employed as a curing agent and a multifunctional epoxy compound having a polycyclic aromatic ring skeleton, such as a bifunctional epoxy compound having a naphthalene skeleton and a bifunctional or trifunctional epoxy compound having an anthracene skeleton, is chosen as major component in the epoxy resin component thereof, joint formation with use of the conductive adhesive can be achieved at a curing temperature not exceeding 180° C. In the obtained cured conductive product, the cured binder resin itself used therefor shows at least a glass transition temperature of 140° C. or higher, and thus for example, even after exposed in a high-temperature environment of 150° C. for a long period of time, the lowering of adhesive strength between the metal surface and the cured conductive product can be slight. Water absorption of the obtained cured conductive product itself in the high-temperature, high humidity environment is extremely low, and it excels in adhesive strength to the metal surface; accordingly, the invasion of moisture into the boundary between the metal surface and the cured conductive product is also suppressed. Therefore, the formation of the oxide layer in the boundary, such as the oxidation of metallic tin by invaded moisture caused by contact potential difference between the surface of the metal, such as the tin/nickel plating layer applied to the metal surface and contacted silver powder or the like, is suppressed, and thus the elevation of contact resistance and microscopic boundary separation and the lowering of adhesive strength in the boundary between the metal surface and the cured conductive product are also effectively suppressed.

Specifically, the conductive joint produced using the conductive adhesive according to the present invention is excellent in long-term reliability in a high-temperature environment of at least 150° C., and long-term reliability under high-temperature, high humidity conditions.

BEST MODE FOR CARRYING OUT THE INVENTION

A conductive adhesive according to the present invention will be explained below in further detail.

The conductive adhesive according to the present invention is a dispersion-type conductive adhesive wherein metal powder used as a conductive medium is evenly dispersed in a one-component epoxy thermosetting resin composition used as a binder resin component. In such a case, the electric conduction paths themselves between particles of the metal powder used as a conductive medium are constructed by the formation of dense physical contact between the metal particles being bound to each other with the epoxy thermosetting resin. Therefore, the conductivity of the cured conductive product itself obtained in heat-curing depends mainly on the density of dense physical contact points formed between the metal particles, and the contacting area thereof. Hence, it is desirable that metal that is superior in ductility is used to expand the contacting area when the metal particles are pressure welded. In addition, it is further desirable that the metal powder itself is composed of a metal having high conductivity. Accordingly, in the present invention, as a metal powder used as a conductive medium, silver powder or a mixed metal powder composed by mixing a small quantity of another metal powder to silver powder is used. It is also preferable that the small quantity of another metal powder used in combination with the silver powder, which is the major material, is also highly ductile metal, and for example, copper powder or zinc powder is preferably applicable to the metal powder used in combination therewith. When mixed metal powder in which a small quantity of another metal powder is mixed to silver powder is used, it is desirable that the ratio of the silver powder to the whole mixed metal powder as volume ratio is selected to be preferably within the range of 70% or more, more preferably within the range of 90% or more.

Although the shape of the metal powder may be spherical, the flake-shaped powder can be combined with the powder with spherical shape. For example, when the powder with flake-shape and the powder with spherical shape are used in combination, the orientation wherein the gaps between the particles of the flake-shaped metal powder are filled with the particles of the spherical metal powder can be attained, and depending on the combination of sizes for both types of powders, it becomes more preferable. Further, in such a case that the metal powder with spherical shape is employed, if two kinds of powders having different particle diameter ranges are used in combination, the orientation wherein the gaps between the particles of the metal powder having larger particle diameter are filled with the particles of the metal powder having smaller particle diameter can be attained, and thus depending on the combination of sizes for both kinds of powders, it becomes more preferable.

The particle diameter of the metal powder to be used is suitably selected to be within the range to achieve an even thickness of the coating film depending on the thickness of the applied film when the conductive adhesive is applied. For example, in reference to the target thickness of the applied film, the particle diameter of the metal powder to be used is selected to be at least within the range between ¼ and ¹⁄₁₀₀, preferably within the range between ⅙ and ¹⁄₄₀ thereof. When the flake-shaped powder and the powder with spherical shape are used in combination, or when two kinds of spherical powder having different particle diameter ranges are used in combination, it is preferable to make such choice that metal powder having a larger size has the particle diameter of the above-described range.

In the obtained cured conductive product, it is necessary that the form in which contained metal powders are densely stacked up will achieve the state wherein gaps between the particles of the metal powder are filled with a binder resin. Therefore, the content ratio of said metal powder and the binder resin component (metal to resin volume ratio) is selected to be at least within the range between 30:70 and 64:36, preferably within the range between 34:66 and 55:45. Correspondingly, for example, when silver powder is employed, the blending rate of the metal powder in the conductive adhesive is selected to be within the range between 80% by mass and 95% by mass, preferably within the range between 85% by mass and 93% by mass. Similarly, when mixed metal powder is employed, it is preferable to select its blending rate to be within said blending rate range.

On the other hand, after the conductive adhesive according the present invention has been applied in a predetermined film thickness onto one surface of the metal surfaces forming junction, the other metal surface has been arranged on the upper surface thereof, and then treatment for pressure welding has been performed so as to achieve dense contact between the metal surface and metal powder dispersed in the conductive adhesive; after that, heating treatment is carried out to cure the one-component epoxy thermosetting resin contained therein. In such a process, the adhesion between the metal surface and the obtained cured conductive product layer, and binding between particles of the contained metal powder are accomplished by the cured product of the epoxy thermosetting resin that is formed therein. Therefore, as required, to the one-component epoxy thermosetting resin composition, an adherence imparting agent may be added in order to improve the adherence between the resin and the metal surface, or the resin and the surface of the metal powder. For example, as such adherence imparting agents, various coupling agents, particularly, silane coupling agents may be preferably used. For epoxy thermosetting resins, such coupling agent as γ-glicidoxypropyl-trimethoxy silane and γ-glicidoxypropyl-methyldiethoxy silane, which can perform treatment to the metal surface simultaneously with the heat curing of the epoxy thermosetting resins, may be preferably used. The amount of the adherence imparting agent to be added should be fitly selected depending on the surface area of the metal to be treated therewith, but in such a case that the target film thickness of the applied film is, for example, within the range of 100 μm or less, it is desirable that the rate of the amount of the silane coupling agent to be added in the conductive adhesive is selected to be within the range between 0.02% by mass and 0.4% by mass, preferably within the range between 0.02% by mass and 0.3% by mass.

The conductive adhesive according to the present invention is used by beforehand applying it onto the surface of one metal surface in a predetermined thickness, when a junction is formed therewith. Therefore, when applying, in order to maintain the film thickness of the applied film, it is required to adjust the viscosity of the conductive adhesive itself within a predetermined viscosity range. For example, in such a case that the target thickness of the applied film is within the range of 100 μm or less, as the applying method, a printing method using a metal mask, or dispense applying method may be used, and its viscosity is to be adjusted within the range suited to each of the applying method. For example, it is desirable that its viscosity fit for the printing method using a metal mask is selected to be within the range between 30 and 500 Pa·s, preferably the range between 40 and 200 Pa·s, and for the dispense applying method, within the range between 2 and 70 Pa·s, preferably the range between 5 and 30 Pa·s.

As the conductive adhesive according to the present invention is prepared in the form of a paste wherein metal powder is dispersed in a high density in a one-component epoxy thermosetting resin composition, an adequate quantity of a solvent may be added to adjust the viscosity within the proper viscosity range depending on the viscosity of the one-component epoxy thermosetting resin to be used itself, or the particle diameter of the metal powder to be used, as long as the volume ratio of the metal powder to the binder resin component to be selected is kept within the above-described range, As such a solvent for adjusting viscosity, a solvent that can be uniformly mixed in the component of the one-component epoxy thermosetting resin to be used is commonly used, and in addition, it is preferable to employ a high-boiling-point solvent that does not easily evaporate during heating treatment after application. Since the one-component epoxy thermosetting resin used in the present invention employs a multifunctional epoxy compound having polycyclic aromatic ring skeletons as the main component for the epoxy resin component (a), and a cyclic acid anhydride as the curing agent (b), esters having high-boiling-point, such as butyl carbitol acetate (acetic acid monoester of diethyleneglycol monobutyl ether, boiling point: 245° C.) may be preferably used therefor.

In the conductive adhesive according to the present invention, the blending ratio of (a) an epoxy resin component comprising at least a multifunctional epoxy compound having a polycyclic aromatic ring skeleton as a major component, to (b) a cyclic acid anhydride having an acid anhydride moiety constituting a ring structure in the molecule used as a curing agent, which are blended as essential components in the one-component epoxy thermosetting resin composition, is selected so that the cyclic acid anhydride for said curing agent (b) is within the equivalents ratio range between 0.7 and 1.1, more preferably between 0.8 and 0.95 equivalent, with respect to the epoxy equivalent of the epoxy resin component (a). Thereby, the amount of unreacted cyclic acid anhydride remaining in the obtained cured product of the epoxy thermosetting resin can be kept in very low level. Further, in order to accelerate the progress of the above-described heat curing reaction, it is desirable that a cure accelerator having the function to accelerate the polymerization reaction of the epoxy compound using the cyctic acid anhydride as the curing agent (b) is added thereto. The amount of the cure accelerator to be added is selected to be within the range of the catalytic quantity to the epoxy resin component (a). The cure accelerator that may be used in the present invention remains intact in the cured conductive product obtained after heat curing, and an imidazole type cure accelerator is preferably used, for example. In the heat curing conditions in the present invention, as the heating temperature is selected to be within a range of 130° C. to 160° C., examples of the imidazole type cure accelerators that can be preferably used in combination with the cyclic acid anhydride of the curing agent (b) in the above-described temperature range include 2E4MZ-CN (product of Shikoku Chemicals Corporation; 1-cyanoethyl-2-ethyl-4-methyl imidazole; molecular weight: 163) and $C_{11}$-Z-CN (product of Shikoku Chemicals Corporation; 1-cyanoethyl-2-undecyl imidazole; melting point: about 50° C.; molecular weight: 275). For example, when said imidazole type cure accelerators are used, the amount of the cure accelerator to be added is desirably selected to be within the range of 0.012 to 0.047 moles, preferably within the range of 0.016 to 0.035 moles of the imidazole type cure accelerator molecules per epoxy equivalent of the epoxy resin component (a).

In the conductive adhesive according to the present invention, the epoxy resin component (a) comprised as an essential component in the one-component epoxy thermosetting resin composition contains at least a multifunctional epoxy compound having a polycyclic aromatic ring skeleton as a major component. Although it is added with a small quantity of epoxy compounds other than the multifunctional epoxy compound having a polycyclic aromatic ring skeleton used as the major component, in order to allow to react with the cyclic acid anhydride used as the curing agent (b), it is desirable that at least bifunctional or more multifunctional epoxy compounds are employed as the other epoxy compounds used in combination. Specifically, it is preferable to use multifunctional epoxy compounds also having a ring structure in the skeleton thereof as other epoxy compounds used in combination. Examples of the multifunctional epoxy compounds having a ring structure in the skeleton thereof include a bisphenol A-type epoxy resin, such as Epikote 828EL (product of JER (Japan Epoxy Resins Co., Ltd.); epoxy equivalent: 187), or a dicyclopentadiene-type epoxy resin, such as Epiclon HP-7200 (product of JER; epoxy equivalent: 247).

In the epoxy resin component (a), it is desirable that, as for the ratio of the multifunctional epoxy compound having a polycyclic aromatic ring skeleton, which is a major component, and other bifunctional or more multifunctional epoxy compounds to be used in combination, to 100 parts by mass of the multifunctional epoxy compound having the polycyclic aromatic ring skeleton, the amount of other bifunctional or more multifunctional epoxy compounds is selected to be within the range between 5 and 50 parts by mass, more preferably within the range between 7 and 40 parts by mass. When the ratio is shown in terms of the number of molecules, it is desirable that the mole ratio of the multifunctional epoxy compound having the polycyclic aromatic ring skeleton to the multifunctional epoxy compound having other ring structures in the skeleton is selected to be within the range between 97:3 and 65:35, preferably within the range between 95:5 and 70:30.

In the epoxy resin component (a), as the multifunctional epoxy compound having the polycyclic aromatic ring skeleton, which is a major component, a multifunctional epoxy compound whose polycyclic aromatic rings is within the range of bicyclic or tricyclic is preferably employed. For example, as for the polycyclic aromatic rings, as a ring of condensed ring type, a naphthalene ring or an anthracene ring is preferable, and it is desirable that, as for a plurality of epoxy groups being present thereon, each ring in the condensed rings has an epoxy group. Specifically, dihydroxynaphthalene diglycidyl ethers, such as 1,6-dihydroxynaphthalene diglycidyl ether can be exemplified as to the bifunctional epoxy compound having the naphthalene skeleton; dihydroxyanthracene diglycidyl ethers as to the bifunctional epoxy compound having the anthracene skeleton; and trihydroxyanthracene triglycidyl ethers, such as 1,2,10-trihydroxyanthracene triglycidyl ether as to the trifunctional epoxy compound having the anthracene skeleton, respectively Although a plurality of multifunctional epoxy compounds each having a polycyclic aromatic ring skeleton can also be used as the major component, it is preferable that the major component contains at least a bifunctional epoxy compound having a naphthalene skeleton. For example, it is more preferable to select such a composition that at least dihydroxynaphthalene diglycidyl ether is comprised as said bifunctional epoxy compound having the naphthalene skeleton.

In the epoxy resin component (a), such a composition that a bifunctional epoxy compound occupies the majority thereof is preferable, and in such a case, a trifunctional epoxy compound or higher multifunctional epoxy compound partially blended therein is used for forming branched chains to form cross-linkage between obtained resin chains, but it is undesirable that excessive cross-linkages or branched chains are introduced thereby. Therefore, it is desirable that the ratio of the bifunctional epoxy compound to the trifunctional or higher multifunctional epoxy compound in the ratio of the number of molecules is selected to be within the range between 100:0 and 65:35, preferably within the range between 100:0 and 70:30.

In the cyclic acid anhydride having an acid anhydride moiety constituting a ring structure in the molecule used as the curing agent (b) for ring-opening the epoxy group to form a resin polymer through formation of an ester bond, it is preferable that the ring structure constituted by the acid anhydride moiety is a 5-membered or 6-membered ring. In addition, it is more preferable that a cyclic acid anhydride having another hydrocarbon ring skeleton fused with the ring structure constituted by the acid anhydride moiety is employed. Examples of cyclic acid anhydrides having other hydrocarbon ring skeletons fused with the ring structure constituted by the acid anhydride moiety, which may be preferably used as such a curing agent, include terpene-modified maleic anhydrides, such as Epicure YH307 (product of JER; molecular weight: 235) or Epicure YH306 (product of JER; molecular weight: 234), and hydrogenated nadic anhydrides, such as Rikacid HNA-100 (product of New Japan Chemical Co., Ltd.; molecular weight: 184).

Epicure YH-306: [Chemical formula 1]

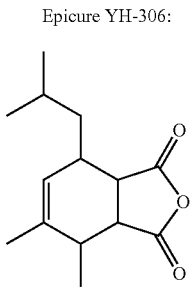

Epicure YH-307: [Chemical formula 2]

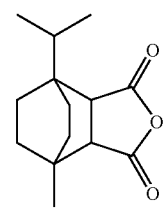

Rikacid HNA-100: [Chemical formula 3]

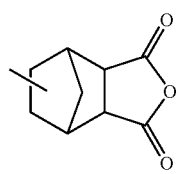

As these exemplified cyclic acid anhydrides, it is more preferable that in the structure of another hydrocarbon ring skeleton fused with the ring structure constituted by the acid anhydride moiety, two or more chain-like hydrocarbon groups are substituted on the ring, and thereby such ring skeleton moiety is bulky; or the structure is a polycyclic structure having cross-link chains on the ring, and thereby the entire ring skeleton portion is bulky. In such a case, it is, in general, preferable that the total number of carbon atoms composing the structure of the hydrocarbon ring skeleton including the chain-type hydrocarbon groups substituted on the ring is 8 or more. However, as it needs to be present in the form being evenly dissolved in the one-component epoxy thermosetting resin composition, it is desirably liquid at the vicinity of room temperature, and it is mere desirable that the total number of carbon atoms composing said structure of hydrocarbon ring skeleton is selected to be within the range of 18 or less, which prevents its melting point from rising up to an excessively high level. As the acid anhydride includes the structure of such bulky hydrocarbon ring skeletons therein, the water absorption of the acid anhydride itself is also suppressed, and in addition, the water absorption of the cured product of the thermosetting resin that is formed therefrom is also suppressed.

Other than those, as illustrated in comparative example 1 or 2, Me-THPA (methyltetrahydrophthalic anhydride; molecular weight: 170; Rikacid MT-500; product of New Japan Chemical Co., Ltd.) or Me-HHPA (methylhexahydrophthalic anhydride; molecular weight: 164; Rikacid MT-700; product of New Japan Chemical Co., Ltd.) may be optionally used.

Me-THPA (Rikacid MT-500): [Chemical formula 4]

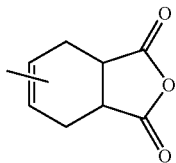

Me-HHPA (Rikacid MT-700): [Chemical formula 5]

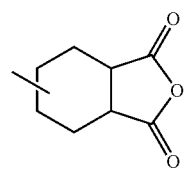

Furthermore, in the present invention, it is preferable to open the ring of the epoxy group on the epoxy compound, and the curing agent (b), which is used for ring-opening the epoxy group of the epoxy compound to form a resin polymer through formation of an ester bond, is involved in such an ring-opening reaction in the form of a cyclic acid anhydride; and thus such a cyclic acid anhydride that will absorb much moisture contained in the air in the duration that the conductive adhesive according to the present invention is put in storage at a normal humidity in the vicinity of room temperature after preparation, and thus that will have a relatively high ratio wherein a part of the cyclic acid anhydride with a part of the absorbed moisture to convert to a corresponding dicarboxylic acid, is generally undesirable. At the heating temperature of the heat curing condition, the corresponding dicarboxylic acid also may initiate ring-opening of the epoxy group to form the resin polymer through formation of the ester bond, but at this time, water molecules are released in proportion to the formation of ester bond. Consequently, if more moisture is absorbed, a part of the cyclic acid anhydride is hydrolyzed, and the ratio of converting a part of the cyclic acid anhydride to the corresponding dicarboxylic acid by hydrolysis is relatively higher, and thus when the cyclic acid anhydride of the curing agent (b) initiates ring-opening of the epoxy group of the epoxy compound to construct the resin polymer through formation of ester bond, the corresponding dicarboxylic acid itself, the water molecules released therefrom, or the absorbed moisture exerts the function to terminate the polymerization chain, which will cause failure of the desired elongating the resin polymer to the desired chain length. Alternatively, if the released water molecule or absorbed moisture remains in the formed cured conductive product, in the state heated to about 85° C. in the existence of unreacted dicarboxylic acid which similarly remains, it may cause the oxidation of the metal surface at the bonded interface between the cured conductive product and the metal surface. In view of these facts, when the cyclic acid anhydride of the curing agent (b) itself is kept for 5 days to expose in an environment, for example, 20° C. and a humidity of 60% RH, the quantity of moisture absorbed in the cyclic acid anhydride (water absorption) per 100 parts by mass of the cyclic acid anhydride is held down preferably within the range of 0.4 part by mass or less, and more preferably within the range of 0.35 part by mass or less. In other words, the quantity of moisture absorbed in the cyclic acid anhydride (water absorption) per mole of the cyclic acid anhydride is held down preferably within the range of 0.052 mole or less, and more preferably of 0.046 mole or less calculated in the terms of water molecule.

In the conductive adhesive according to the present invention, as the one-component epoxy thermosetting resin composition having the above-described composition is used as the component of the binder resin, the obtained cured product of the epoxy thermosetting resin has a polycyclic aromatic ring skeleton in the chain thereof, and its glass transition temperature reaches at least 140° C. or higher, and frequently 150° C. or higher. In addition to the improvement of the modulus of elasticity of the binder resin itself, the optimization of the volume ratio of the metal powder and the binder resin to the range to provide good conductivity and low contact resistance is accomplished for the cured conductive product obtained, and at the same time, in this content ratio, the suppression of aged deterioration of the adhesive strength can be achieved when the entire cured conductive product is loaded, for example, with cooling-heating temperature cycle test.

In the bonded interface, between the metal powder and mechanically contacted metal surface in the cured conductive product, for example, when the metal surface is coated with an Sn or Sn alloy layer, such as tin/nickel plating fitting to soldering, during storage at 150° C. for a long period of time, local alloying occurs generally in the contact interface of the silver powder, which is used as the metal powder, and the Sn or Sn alloy. Although the conductive adhesive according to the present invention has no function to suppress this phenomenon itself, in the boundary where the metal surface is in contact with the binder resin, the high adherence of the resin to the metal surface is achieved by using the binder resin in combination with the function of the adherence imparting agent to the surface of the Sn or Sn alloy layer to prevent the lowering of total adhesive strength. As the obtained cured product of the epoxy thermosetting resin has a polycyclic aromatic ring skeleton in the chain thereof, even in the high-temperature, high-humidity environment, the moisture absorption thereof itself is extremely low, and the peeling of the edge end portion by the strain stress caused by difference in the coefficient of thermal expansion, which is loaded onto the boundary where the metal surface contacts the binder resin, is also restrained, and thus the invasion of moisture into the boundary is effectively suppressed. Therefore, the oxidation of tin that is accelerated, in the high-temperature, high-humidity environment, by contact potential difference between both metals in the contact interface of the tin/nickel plating layer formed on the surface of the metal and the metal powder such as silver powder, which is caused by moisture invading in the joint interface between the metal surface and the cured conductive product, can be effectively prevented, and thus the elevation of contact resistance and lowering of adhesive strength caused by tin oxide layer formed in the contact interface can also be effectively prevented.

EXAMPLES

The present invention will be more specifically illustrated hereunder referring to examples. Although these examples are certain examples of the best modes for carrying out the present invention, the scope of the present invention is in no way limited to these specific examples.

For evaluating the properties and performances of paste-like conductive adhesives (conductive paste) disclosed in the following examples and comparative examples, each evaluation item was measured using the below-described procedures and conditions.

I. Resin Properties of Epoxy Thermosetting Resin per se used in Paste-like Conductive Adhesives

[Glass Transition Temperature (Tg)]

A cured resin product of the epoxy thermosetting resin per se is prepared under curing conditions of 150° C. and 60 minutes. For the obtained cured resin product, the glass transition temperature (Tg) is measured using a DSC (differential scanning calorimeter) under a condition that temperature elevation rate is set at 10° C./min.

[Water Absorption of Acid Anhydride]

The water absorption of the acid anhydride per se used as a curing agent that is blended in the epoxy thermosetting resin per se is measured. In a beaker having a bore (diameter) of 50 mm, 30 g of an acid anhydride in question is placed and is held for 5 days under a constant temperature, constant humidity atmosphere of 20° C. and 60% RH, and then increase in the total mass is measured, which is considered to be the amount of water absorbed by the acid anhydride in the period (moisture absorption). The coefficient of water absorption of the acid anhydride is defined as the ratio of the amount of water absorbed (moisture absorption) to the initial mass of the acid anhydride.

[Water Absorption of Cured Resin]

The epoxy thermosetting resin is cured under the curing conditions of 150° C. and 60 minutes to prepare a cured resin molded product of a disc shape having a diameter of 20 mm and a thickness of 2 mm. The cured resin molded product is directed to undergo treatment of holding for 300 hours under constant temperature, constant humidity conditions of 85° C. and 85% RH, the total masses before and after the treatment are measured, the increase in the mass due to said treatment is deemed to be attributed to the water absorbed by the cured resin product; and thus the coefficient of water absorption of the cured resin product is defined as the ratio of increase in the mass to the total mass before the treatment for holding.

II. Performance of Conductive Adhesive (Conductive Paste)

[Viscosity]

The paste viscosity of the prepared conductive adhesive (conductive paste) is measured using a spiral viscosity meter under the conditions of 25° C. and 10 rpm.

[Volume Resistivity]

An objective conductive adhesive (conductive paste) is applied onto a glass plate in a width of 1 cm, a length of 5 cm and a thickness of 30 μm, and then cured under curing conditions of 150° C. and 60 minutes to prepare a cured conductive product therefrom. After evaluating the average film thickness of the obtained thin-film cured conductive product, the resistance thereof is measured using a 4-terminal method, and the volume specific resistivity is calculated assuming that the cured conductive product is a uniform conductor having a width of 1 cm, a length of 5 cm and said average film thickness evaluated.

[Contact Resistance]

The conductive adhesive (conductive paste) is applied by printing on a silver-plated ceramic substrate in a width of 0.9 mm, a length of 1.5 mm and a thickness of 100 μm using a metal mask. On the applied conductive paste film, a nickel/tin-plated 3216 chip capacitor (electrode size: 0.6 mm wide and 1.5 mm long) is mounted, the conductive adhesive is cured under curing conditions of 150° C. and 60 minutes to form a joint made of the cured conductive product.

After forming the joint, the resistance value between the silver-plated film on the ceramic substrate and the nickel/tin-plated electrode layer of the chip capacitor is measured using the 4-terminal method.

The mean value and the standard dispersion σ of the measured resistance values for a plurality of samples are calculated, and samples deviated by more than 2σ from the mean value are excluded as "abnormal samples" and the results of "normal samples" within 2σ are used in the following evaluations. The "contact resistance" measured immediately after forming the joint is defined as the mean value of measured values of said "normal samples".

[Adhesive Strength]

The conductive adhesive (conductive paste) is applied by printing on a silver-plated ceramic substrate in a width of 0.9 mm, a length of 1.5 mm and a thickness of 100 μm using a metal mask. On the applied conductive paste film, a nickel/tin-plated 3216 chip capacitor (electrode size: 0.6 mm wide and 1.5 mm long) is mounted, the conductive adhesive is cured under curing conditions of 150° C. and 60 minutes to form a joint made of the cured conductive product. The junction is made between the silver-plated layer on the substrate and the nickel/tin-plated electrodes of the chip capacitor.

After the joint has been formed, a hexagonal nut (M2 type) is fixed to the chip capacitor by adhering with an adhesive. The ceramic substrate is fastened, and the hexagonal nut (M2 type) is polled at 10 mm/min to measure the tensile strength of the joint between the silver-plated film on the ceramic substrate and the nickel/tin-plated electrode layer of the chip capacitor.

The mean value and the standard dispersion σ of the measured values of tensile strength for a plurality of samples are calculated, and samples deviated by more than 2σ a from the mean value are excluded as "abnormal samples" and the results of "normal samples" within 2σ are used in the following evaluations. The "adhesive strength" measured immediately after forming the joint is defined as the mean value of measured values of said "normal samples".

[Storage Test at 150° C.]

The conductive adhesive (conductive paste) is applied by printing on a silver-plated ceramic substrate in a width of 0.9 mm, a length of 1.5 mm and a thickness of 100 μm using a metal mask. On the applied conductive paste film, a nickel/tin-plated 3216 chip capacitor (electrode size: 0.6 mm wide and 1.5 mm long) is mounted, the conductive adhesive is cured under curing conditions of 150° C. and 60 minutes to form a joint made of the cured conductive product.

After the joint has been formed, the "contact resistance" measured at room temperature immediately after forming the joint is once evaluated, and then "abnormal samples" are put away to select "normal samples".

After aging the selected "normal samples" at 150° C. (1% RH or less) for 1000 hours, the resistance value (contact resistance) between the silver-plated film on the ceramic substrate and the nickel/tin-plated electrode layer of the chip capacitor, and the tensile strength (adhesive strength) of the joint are measured.

The mean value of the measured resistance values as well as adhesive strength for a plurality of samples are calculated to employ as the evaluation value for contact resistance and adhesive strength after the "storage test at 150° C.".

[Storage Test at 85° C., 85% RH]

The conductive adhesive (conductive paste) is applied by printing on a silver-plated ceramic substrate in a width of 0.9 mm, a length of 1.5 mm and a thickness of 100 μm using a metal mask. On the applied conductive paste film, a nickel/tin-plated 3216 chip capacitor (electrode size: 0.6 mm wide and 1.5 mm long) is mounted, the conductive adhesive is cured under curing conditions of 150° C. and 60 minutes to form a joint made of the cured conductive product.

After the joint has been formed, the "contact resistance" measured at room temperature immediately after forming the joint is once evaluated, and then "abnormal samples" are put away to select "normal samples".

After aging the selected "normal samples" at constant temperature and constant humidity conditions: 85° C., 85% RH for 1000 hours, the resistance value (contact resistance) between the silver-plated film on the ceramic substrate and the nickel/tin-plated electrode layer of the chip capacitor, and the tensile strength (adhesive strength) of the joint are measured.

The mean value of the measured resistance values as well as adhesive strength for a plurality of samples are calculated to employ as the evaluation value for contact resistance and adhesive strength after the "storage test at 85° C., 85% RH".

[Cooling-heating Cycle Test (TCT)]

The conductive adhesive (conductive paste) is applied by printing on a silver-plated ceramic substrate in a width of 0.9 mm, a length of 1.5 mm and a thickness of 100 μm using a metal mask. On the applied conductive paste film, a nickel/tin-plated 3216 chip capacitor (electrode size: 0.6 mm wide and 1.5 mm long) is mounted, the conductive adhesive is cured under curing conditions of 150° C. and 60 minutes to form a joint made of the cured conductive product.

After the joint has been formed, the "contact resistance" measured at room temperature immediately after forming the joint is once evaluated, and then "abnormal samples" are put away to select "normal samples".

After the selected "normal samples" being directed to undergo continuous 1000 cycles of cooling-heating cycle of cooling: −40° C. for 30 minutes and heating: 125° C. for 30 minutes, the resistance value (contact resistance) between the silver-plated film on the ceramic substrate and the nickel/tin-plated electrode layer of the chip capacitor, and the tensile strength (adhesive strength) of the joint are measured.

The mean value of the measured resistance values as well as adhesive strength for a plurality of samples are calculated to employ as the evaluation value for contact resistance and adhesive strength after the "cooling-heating cycle test (TCT)".

In addition, in the above-described test conditions, the ranges that satisfies 10 mΩ or less for the "contact resistance" measured immediately after forming the joint, and 30 N/(2× 0.9 mm$^2$)=30 N/1.8 mm$^2$ or more for the "adhesive strength" measured immediately after forming the joint, respectively, are ranked with level of practically "good products". In addition, in the test for evaluating the reliability of each item, if the "contact resistance" and "adhesive strength" evaluated after undergoing each accelerated test treatment remain within the above-described ranges, the product is judged to have a practically "sufficient reliability".

Further, all of epoxy resins, curing agents, cure accelerators, silane coupling agents, and solvents used in the Examples and Comparative Examples described below are liquid at 25° C. with the exception of few materials whose melting points are otherwise described. On the other hand, those being solid at 25° C. are also in the state where they are uniformly mixed in the obtained composition as a result of dissolving in other liquid components during preparation.

Examples 1 to 5

Spherical silver powder having an average particle diameter of 3 μm was employed as the metal powder for the conductive medium to be blended in the conductive paste; and the spherical silver powder was evenly dispersed by stirring in the one-component epoxy thermosetting resin component to prepare the conductive paste of the compounding composition listed in Table 1.

In said one-component epoxy thermosetting resin component, used for the epoxy resin component thereof were Epiclon HP-4032D (product of JER; 1,6-dihydroxynaphthalene diglycidyl ether, epoxy equivalent: 142) as the epoxy compound having naphthalene skeletons;

THATGE (1,2,10-trihydroxyanthracene triglycidyl ether, epoxy equivalent: 142) as the trifunctional epoxy compound having anthracene skeletons, Epikote 828EL, which is a bisphenol A-type epoxy resin (product of JER; epoxy equivalent: 187), or Epiclon HP-7200, which is a dicyclopentadiene-type epoxy resin (product of JER; epoxy equivalent: 247), as other epoxy compounds;

used as the curing agent therefor was

Epicure YH307 (product of JER; molecular weight: 235) or Epicure YH306 (product of JER; molecular weight: 234), which is terpene-modified maleic anhydrides as the cyclic acid anhydride;

used as the cure accelerator therein was

2E4MZ-CN (product of Shikoku Chemicals Corporation; 1-cyanoethyl-2-ethyl-4-methyl imidazole; molecular weight: 163) as the imidazole compound;

as for other added components, used as the adherence imparting agent was

KBE-403 (product of Shin-Etsu Chemical Co., Ltd.; γ-glycidoxypropyl-trimethoxy silane) as the silane coupling agent; and further used as the diluting solvent component for adjusting the viscosity of the conductive paste was butylcarbitol acetate, which is the high-boiling-point solvent (mono-acetate ester of diethylene glycol monobutyl ether; boiling point: 245° C.), wherein they were blended in the ratio of % by mass listed in Table 1, respectively, to compose the dispersing solvent for the metal powder.

In Examples 1 to 5, in the aforementioned one-component epoxy thermosetting resin component, the content ratio of the epoxy compound having naphthalene skeletons to other epoxy compounds was 3:1, and on the other hand, the blending ratio of 0.9 molecule of said dicarboxylic-acid derived cyclic acid anhydride to 2 epoxy groups was selected. In addition, to 1 mole of the epoxy groups, 0.023 mole of the imidazole compound was added as the cure accelerator. Further, to 100 parts by mass of the aforementioned one-component epoxy thermosetting resin component excluding the solvent component for adjusting viscosity, the silane coupling agent was added at a ratio of 1.0 part by mass.

TABLE 1

| | | | Examples | | | | |
|---|---|---|---|---|---|---|---|
| | | | 1 | 2 | 3 | 4 | 5 |
| Compounding ratio | Epoxy thermosetting resin component (parts by mass) | | | | | | |
| | Epoxy resin component | Epikote 828EL | 0.8 | 1.7 | | 1.0 | |
| | | Epiclon HP4032D | 2.4 | 5.1 | 2.4 | 3.0 | 2.9 |
| | | Epiclon HP7200 | | | 1.0 | | |
| | | THATGE | | | | | 1.0 |
| | | Adeka Resin EPR-4023 | | | | | |
| | | Epikote 630 | | | | | |

TABLE 1-continued

| | | | Examples | | | | |
|---|---|---|---|---|---|---|---|
| | | | | 1 | 2 | 3 | 4 | 5 |
| | Curing agent component | Epicure YH307 | | 4.5 | 9.5 | | 5.8 | 4.5 |
| | | Epicure YH306 | | | | 5.7 | | |
| | | Rikacid HNA-100 | | | | | | |
| | | Me-THPA | | | | | | |
| | | Me-HHPA | | | | | | |
| | | MY-23 | | | | | | |
| | Cure accelerator | 2E4MZ-CN | | 0.1 | 0.2 | 0.1 | 0.1 | 0.1 |
| | | $C_{11}$—Z—CN | | | | | | |
| | Adherence imparting agent | KBE-402 | | | | | | |
| | | KBE-403 | | 0.1 | 0.2 | 0.1 | 0.1 | 0.1 |
| | Solvent | Butylcarbitol acetate | | 1.2 | | 0.8 | 0.4 | 2.0 |
| | Silver powder | (parts by mass) | | 90.9 | 83.3 | 91.3 | 89.6 | 88.2 |
| | | (Volume content: %) | | 52.3 | 52.3 | 53.8 | 49.3 | 45.1 |
| Resin properties | | Tg | °C. | 153 | 153 | 141 | 152 | 162 |
| | | Acid anhydride water absorption | % | 0.3 | 0.3 | 0.3 | 0.4 | 0.3 |
| | | Cured resin water absorption | % | 0.97 | 0.97 | 0.82 | 0.97 | 0.80 |
| Performance of conductive adhesive | | Viscosity | Pa · s | 95 | 85 | 120 | 100 | 135 |
| | | Volume resistivity | µΩ · cm | 42 | 890 | 70 | 51 | 83 |
| | | Contact resistance | mΩ | 5 | 8 | 6 | 5 | 6 |
| | | Adhesive strength | N/1.8 mm² | 42 | 43 | 33 | 41 | 45 |
| Storage test at 150° C. (1000 hr) | | Contact resistance | mΩ | 3 | 7 | 4 | 4 | 5 |
| | | Adhesive strength | N/1.8 mm² | 34 | 48 | 33 | 33 | 32 |
| Storage test at 85° C., 85% RH (1000 hr) | | Contact resistance | mΩ | 5 | 7 | 5 | 6 | 6 |
| | | Adhesive strength | N/1.8 mm² | 41 | 45 | 38 | 39 | 40 |
| TCT (1000 cycles) | | Contact resistance | mΩ | 4 | 7 | 4 | 5 | 6 |
| | | Adhesive strength | N/1.8 mm² | 35 | 33 | 32 | 33 | 32 |

Example 6

In comparison with the aforementioned conductive paste of Example 1, $C_{11}$-Z-CN (product of Shikoku Chemicals Corporation; 1-cyanoethyl-2-undecyl imidazole; melting point: about 50° C.; molecular weight: 275) was employed as a cure accelerator in place of 2E4MZ-CN, and, with this exception, otherwise the same compounding conditions were chosen to prepare a conductive paste having the composition listed in Table 2.

In similar way as in Examples 1 to 5, in Example 6, in the one-component epoxy thermosetting resin component therefor, the content ratio of the epoxy compound having naphthalene skeletons to other epoxy compounds was 3:1, and on the other hand, the blending ratio of 0.9 molecule of the above-described dicarboxylic-acid derived cyclic acid anhydride to 2 epoxy groups was selected. In addition, 0.016 mole of the imidazole compound, which is a cure accelerator, was added to 1 mole of the epoxy group. Further, a silane coupling agent was added at a ratio of 1.0 part by mass with respect to 100 parts by mass of the one-component epoxy thermosetting resin component excluding the diluting solvent component for adjusting the viscosity of the conductive paste.

Example 7

As the metal powder for the conductive medium to be blended in the conductive paste, the mixture of spherical silver powder having an average particle diameter of 3 µm and flake-shaped silver powder having an average particle diameter of 3 µm mixed in a mass ratio of 70% spherical silver powder/30% flake-shaped silver powder was employed, and the two kinds of silver powders were dispersed by mixing in the one-component epoxy thermosetting resin component using a three-roll kneader to prepare an evenly dispersed conductive paste having the composition listed in Table 2.

In similar way as in Examples 1 to 5, in Example 7, in the aforementioned one-component epoxy thermosetting resin component, the content ratio of the epoxy compound having naphthalene skeletons to other epoxy compounds was 3:1, and on the other hand, the blending ratio of 0.9 molecule of the above-described dicarboxylic-acid derived cyclic acid anhydride to 2 epoxy groups was also selected. In addition, 0.023 mole of the imidazole compound, which is a cure accelerator, was added to 1 mole of the epoxy group. Further, a silane coupling agent was added at a ratio of 1.0 part by mass with respect to 100 parts by mass of the one-component epoxy thermosetting resin component excluding the diluting solvent component for adjusting the viscosity of the conductive paste.

Example 8

As the metal powder for the conductive medium to be blended in the conductive paste, the mixture of spherical silver powder having an average particle diameter of 3 µm and metallic zinc (Zn) powder having an average particle diameter of 10 µm mixed in a mass ratio of 97% spherical silver powder/3% Zn powder was employed, and the two kinds of metal powders were dispersed by mixing in the one-component epoxy thermosetting resin component using a three-roll kneader to prepare an evenly dispersed conductive paste having the composition listed in Table 2.

The one-component epoxy thermosetting resin component used in Example 8 was set in the same composition as that of the aforementioned one-component epoxy thermosetting resin component used in Example 7.

Example 9

As the metal powder for the conductive medium to be blended in the conductive paste, the mixture of spherical silver powder having an average particle diameter of 3 μm and copper (Cu) powder having an average particle diameter of 1 μm mixed in a mass ratio of 99% -spherical silver powder/1% Cu powder was employed, and the two kinds of metal powders were dispersed by mixing in the one-component epoxy thermosetting resin component using a three-roll kneader to prepare an evenly dispersed conductive paste having the composition listed in Table 2.

The one-component epoxy thermosetting resin component used in Example 9 was set in the same composition as that of the aforementioned one-component epoxy thermosetting resin component used in Example 7.

Example 10

In comparison with the above-described conductive paste of Example 1, hydrogenated nadic anhydride Rikacid HNA-100 (product of New Japan Chemical Co., Ltd.; molecular weight: 184) was used as a curing agent in place of Epicure-YH307, which is terpene-modified maleic anhydride, and, with this exception, otherwise the same compounding conditions were chosen to prepare a conductive paste having the composition listed in Table 2.

In similar way as in Examples 1 to 5, in Example 10, in the above-described one-component epoxy thermosetting resin component, the content ratio of the epoxy compound having naphthalene skeletons to other epoxy compounds was 3:1, and on the other hand, the blending ratio of 0.9 molecule of the above-described dicarboxylic-acid derived cyclic acid anhydride to 2 epoxy groups was also selected. In addition, 0.023 mole of the imidazole compound, which is a cure accelerator, was added to 1 mole of the epoxy group. Further, a silane coupling agent was added at a ratio of 1.2 parts by mass with respect to 100 parts by mass of the one-component epoxy thermosetting resin component excluding the diluting solvent component for adjusting the viscosity of the conductive paste.

TABLE 2

| | | | | | Examples | | | |
| --- | --- | --- | --- | --- | --- | --- | --- | --- |
| | | | | 6 | 7 | 8 | 9 | 10 |
| Compounding ratio | Epoxy thermosetting resin component (parts by mass) | | | | | | | |
| | Epoxy resin component | Epikote 828EL | | 0.8 | 1.0 | 1.0 | 1.0 | 1.1 |
| | | Epiclon HP4032D | | 2.4 | 3.0 | 3.0 | 3.0 | 3.4 |
| | | Epiclon HP7200 | | | | | | |
| | | THATGE | | | | | | |
| | | Adeka Resin EPR-4023 | | | | | | |
| | | Epikote 630 | | | | | | |
| | Curing agent component | Epicure YH307 | | 4.5 | 5.6 | 5.6 | 5.6 | |
| | | Epicure YH306 | | | | | | |
| | | Rikacid HNA-100 | | | | | | 5.0 |
| | | Me-THPA | | | | | | |
| | | Me-HHPA | | | | | | |
| | | MY-23 | | | | | | |
| | Cure accelerator | 2E4MZ-CN | | | 0.1 | 0.1 | 0.1 | 0.1 |
| | | $C_{11}$—Z—CN | | 0.1 | | | | |
| | Adherence imparting agent | KBE-402 | | | | | | |
| | | KBE-403 | | 0.1 | 0.1 | 0.1 | 0.1 | 0.1 |
| | Solvent | Butylcarbitol acetate | | 1.2 | 1.5 | 1.5 | 1.5 | 1.5 |
| | Silver powder | (parts by mass) | | 90.9 | 88.6 | 88.6 | 88.6 | 88.7 |
| | | (Volume content: %) | | 52.3 | 46.2 | 46.2 | 46.2 | 45.5 |
| Resin properties | | Tg | °C. | 157 | 153 | 153 | 153 | 162 |
| | | Acid anhydride water absorption | % | 0.3 | 0.3 | 0.3 | 0.3 | 0.3 |
| | | Cured resin water absorption | % | 0.99 | 0.97 | 0.97 | 0.97 | 0.98 |
| Performance of conductive adhesive | | Viscosity | Pa·s | 102 | 103 | 110 | 97 | 95 |
| | | Volume resistivity | μΩ·cm | 61 | 35 | 55 | 51 | 42 |
| | | Contact resistance | mΩ | 6 | 3 | 6 | 6 | 5 |
| | | Adhesive strength | N/1.8 mm$^2$ | 38 | 50 | 40 | 45 | 42 |
| Storage test at 150° C. (1000 hr) | | Contact resistance | mΩ | 5 | 4 | 5 | 5 | 3 |
| | | Adhesive strength | N/1.8 mm$^2$ | 34 | 39 | 33 | 36 | 34 |
| Storage test at 85° C., 85% RH (1000 hr) | | Contact resistance | mΩ | 5 | 6 | 6 | 8 | 5 |
| | | Adhesive strength | N/1.8 mm$^2$ | 32 | 38 | 42 | 34 | 41 |
| TCT (1000 cycles) | | Contact resistance | mΩ | 5 | 4 | 6 | 6 | 4 |
| | | Adhesive strength | N/1.8 mm$^2$ | 34 | 36 | 33 | 34 | 35 |

As for the conductive pastes of the above-described Examples 1 to 10, as Tables 1 and 2 show, when the evaluation results of "contact resistance" and "adhesive strength" measured after the "storage test at 150° C.", "storage test at 85° C., 85% RH", and the "cooling-heating cycle test (TCT)" are compared with the evaluation results of "contact resistance" and "adhesive strength" measured immediately after forming the joint, at least the "contact resistance" stays within 10 mΩ or lower, the "adhesive strength" stays within the range that satisfies 30N/1.8 mm² or higher, and thus the pastes are judged to have "sufficient reliability". Actually in Examples 1 to 10, the "water adsorption of cured resin products" measured for the epoxy thermosetting resin used therein is kept within the low level.

Comparative Examples 1 and 2

As the metal powder for the conductive medium to be blended in the conductive paste, spherical silver powder having an average particle diameter of 3 μm was employed, and the spherical silver powder was dispersed by stirring in the one-component epoxy thermosetting resin component to prepare an evenly dispersed conductive paste having the composition listed in Table 3.

In the one-component epoxy thermosetting resin component of the Comparative Examples 1 and 2, in place of Epicure YH307 being terpene-modified maleic anhydride, which is the cyclic acid anhydride used in Example 1 as the curing agent, Me-THPA (methyltetrahydrophthalic anhydride; molecular weight: 170; Rikacid MT-500; product of New Japan Chemical Co., Ltd.) was used in Comparative Example 1; and Me-HHPA (methylhexahydrophthalic anhydride; molecular weight: 164; Rikacid MT-700; product of New Japan Chemical Co., Ltd.) was used in Comparative Example 2.

In similar way as in Example 1, in Comparative Examples 1 and 2, the content ratio of the epoxy compound having naphthalene skeletons to other epoxy compounds was 3:1, and the compounding ratio of 0.9 molecule of the above-described dicarboxylic-acid derived cyclic acid anhydride to 2 epoxy groups was also selected. In addition, 0.023 mole of the imidazole compound, which is a cure accelerator, was added to 1 mole of the epoxy group. Further, a silane coupling agent was added at a ratio of 1.6 parts by mass with respect to 100 parts by mass of the one-component epoxy thermosetting resin component excluding the diluting solvent component for adjusting the viscosity of the conductive paste.

Comparative Examples 3 and 4

As the metal powder for the conductive medium to be blended in the conductive paste, spherical silver powder having an average particle diameter of 3 μm was employed, and the spherical silver powder was dispersed by stirring in the one-component epoxy thermosetting resin component to prepare an evenly dispersed conductive paste having the composition listed in Table 3.

In the one-component epoxy thermosetting resin component of Comparative Example 3, in the contained epoxy resin component contained therefor, the blending ratio of the epoxy compound having naphthalene skeletons to other epoxy compounds was selected to be about 1:5; and in the one-component epoxy thermosetting resin component of Comparative Example 4, no epoxy compounds having naphthalene skeletons were blended as the epoxy resin components to be contained therein, but Epikote 828EL, which is a bisphenol-A-type epoxy resin, and ADEKA Resin EPR-4023, which is a nitryl-modified epoxy resin (product of ADEKA Corporation; epoxy equivalent: 220) were blended.

On the other hand, in similar way as in Example 1, the blending ratio of 0.9 molecule of the dicarboxylic-acid derived cyclic acid anhydride, which is a curing agent, to 2 epoxy groups was also selected in Comparative Examples 3 and 4. In addition, 0.027 mole of the imidazole compound, which is a cure accelerator, was added to 1 mole of the epoxy group. Further, a silane coupling agent was added at a ratio of 1.1 parts by mass with respect to 100 parts by mass of the one-component epoxy thermosetting resin component excluding the diluting solvent component for adjusting the viscosity of the conductive paste.

Comparative Example 5

As the metal powder for the conductive medium to be blended in the conductive paste, spherical silver powder having an average particle diameter of 3 μm was employed, and the spherical silver powder was dispersed by stirring in the one-component epoxy thermosetting resin component using a three-roll kneader to prepare an evenly dispersed conductive paste having the composition listed in Table 3.

In the one-component epoxy thermosetting resin component of Comparative Example 5, as the epoxy resin component therefor, no epoxy compounds having naphthalene skeletons was blended, but, as an alternative, Epikote 630, which is a trifunctional epoxy resin (product of JER, epoxy equivalent: 98), was employed;

as the curing agent,

MY-23, which is an amine adduct curing agent (product of Ajinomoto Co. Inc.), was used instead of the cyclic acid anhydride;

no cure accelerators were mixed therein;

as other additive components,

KBE-402 (product of Shin-Etsu Chemical Co. Ltd.; γ-glycidoxypropyl-methyl-diethoxysilane) was mixed as a silane coupling agent to be utilized as an adherence imparting agent; and further as a diluting solvent component for adjusting the viscosity of the conductive paste, butylcarbitol acetate (acetic acid monoester of diethylene glycol monobutyl ether) was used;

wherein they were blended in the ratio of % by mass listed in Table 3, respectively, to compose the dispersion solvent for metal powder.

TABLE 3

| | | | Comparative Examples | | | | |
|---|---|---|---|---|---|---|---|
| | | | 1 | 2 | 3 | 4 | 5 |
| Compounding ratio | Epoxy thermosetting resin component (parts by mass) | | | | | | |
| | Epoxy resin component | Epikote 828EL | 1.6 | 1.6 | 3.8 | 3.5 | |
| | | Epiclon HP4032D | 4.8 | 4.8 | 0.7 | | |
| | | Epiclon HP7200 | | | | | |
| | | THATGE | | | | | |

TABLE 3-continued

| | | | Comparative Examples | | | | |
|---|---|---|---|---|---|---|---|
| | | | 1 | 2 | 3 | 4 | 5 |
| | Curing agent component | Adeka Resin EPR-4023 | | | | 1.2 | |
| | | Epikote 630 | | | | | 6.6 |
| | | Epicure YH307 | | | 5.3 | 5.1 | |
| | | Epicure YH306 | | | | | |
| | | Rikacid HNA-100 | | | | | |
| | | Me-THPA | 3.2 | | | | |
| | | Me-HHPA | | 3.2 | | | |
| | | MY-23 | | | | | 1.6 |
| | Cure accelerator | 2E4MZ-CN | 0.2 | 0.2 | 0.1 | 0.1 | |
| | | C₁₁—Z—CN | | | | | |
| | Adherence imparting agent | KBE-402 | | | | | 0.7 |
| | | KBE-403 | 0.2 | 0.2 | 0.1 | 0.1 | |
| | Solvent | Butylcarbitol acetate | 0.8 | 0.8 | 0.8 | 0.8 | 1.6 |
| | Silver powder | (parts by mass) | 89.3 | 89.3 | 89.3 | 89.3 | 89.5 |
| | | (Volume content: %) | 60.8 | 61.2 | 61.3 | 61.5 | 70.5 |
| Resin properties | | Tg °C. | 165 | 169 | 94 | 54 | 92 |
| | | Acid anhydride water absorption % | 0.6 | 1.2 | 0.3 | 0.3 | — |
| | | Cured resin water absorption % | 1.8 | 2.4 | 1.4 | 1.6 | 4.99 |
| Performance of conductive adhesive | | Viscosity Pa·s | 78 | 73 | 53 | 89 | 68 |
| | | Volume resistivity μΩ·cm | 90 | 95 | 160 | 780 | 250 |
| | | Contact resistance mΩ | 5 | 6 | 6 | 6 | 7 |
| | | Adhesive strength N/1.8 mm² | 42 | 40 | 41 | 36 | 38 |
| Storage test at 150° C. (1000 hr) | | Contact resistance mΩ | 4 | 5 | 6 | 16 | 6 |
| | | Adhesive strength N/1.8 mm² | 31 | 30 | 19 | 21 | 20 |
| Storage test at 85° C., 85% RH (1000 hr) | | Contact resistance mΩ | 80 | 340 | 8 | 530 | 25 |
| | | Adhesive strength N/1.8 mm² | 22 | 15 | 24 | 9 | 35 |
| TCT (1000 cycles) | | Contact resistance mΩ | 7 | 7 | 5 | 6 | 6 |
| | | Adhesive strength N/1.8 mm² | 27 | 26 | 37 | 36 | 33 |

Regarding the aforementioned conductive pastes of Comparative Examples 1 to 5, as shown in Table 3, as for the "contact resistance" and "adhesive strength" measured immediately after forming the joint, the results therefor were both within the range to be judged as practically "conforming products"; however, regarding at least the evaluation results of the "contact resistance" and "adhesive strength" measured after the "storage test at 85° C., 85% RH", the results therefor were not maintained within such range of 10 mΩ or lower for the "contact resistance" and of 30 N/1.8 mm² or higher for the "adhesive strength"; in view of those results, for the purpose of forming the joint using a conductive resin that is applied in the fabrication of electronic devices and modules equipped for vehicles, the conductive pastes cannot be judged to have practically "sufficient reliability". In addition, the "water adsorption of cured resin products" measured for the epoxy thermosetting resin used in Comparative Examples 1 to 4 is in a considerably high level.

INDUSTRIAL APPLICABILITY

The conductive joint fabricated using the conductive adhesive according to the present invention is excellent in long-term reliability in high-temperature environment of at least 150° C., long-term reliability under high-temperature, high-humidity conditions, and long-term reliability in cooling-heating temperature cycle environment. For example, the conductive adhesive can be used as means for the surface mounting of electronic parts on the substrate circuit, which are intended for in-vehicle electronic devices, modules and the like; and further as a conductive adhesive suited for the purpose of substituting soldering, which is capable of forming a conductive joint under a low-temperature condition at least not exceeding 180° C. in the fabrication of electronic parts themselves.

The invention claimed is:

1. A conductive adhesive consisting of a conductive medium and a binder resin component,
    wherein the conductive medium is metal powder, and the binder resin component is a one-component epoxy thermosetting resin composition,
    the conductive adhesive is a dispersion in which the metal powder is dispersed in said one-component epoxy thermosetting resin composition with a content ratio of the metal powder to the binder resin component in terms of volume ratio being selected within a range between 34:66 and 55:45,
    the metal powder is silver powder or mixed metal powder comprising silver powder mixed with a small quantity of other metal powder,
    the ratio of the silver powder to the entire metal powder is selected to be at least within the range of 70% or more in a volume ratio,
    said one-component epoxy thermosetting resin composition is a liquid composition essentially consisting of:
    (a) an epoxy resin component,
    (b) a curing agent for the epoxy resin component,
    (c) a cure accelerator, (d) an adherence imparting agent, and
(e) a diluting solvent,
wherein the epoxy resin component is a mixture of two or more multifunctional epoxy compounds being selected from a group consisting of bifunctional epoxy compounds and trifunctional epoxy compounds, in which mixture the ratio of the bifunctional epoxy compound to the trifunctional epoxy compound in terms of mole ratio is selected to be within the range between 100:0 and 70:30,
the mixture of two or more multifunctional epoxy compounds is a combination of a multifunctional epoxy compound having a polycyclic aromatic ring skeleton and a multifunctional epoxy compound having a ring structure other than polycyclic aromatic ring in the skeleton, in which combination the mole ratio of the multifunctional epoxy compound having the polycyclic aromatic ring skeleton to the multifunctional epoxy compound having the other ring structure in the skeleton is selected to be within the range between 95:5 and 70:30,
wherein the mixture of two or more multifunctional epoxy compounds consists of two or more multifunctional epoxy compounds selected from a group consisting of multifunctional epoxy compounds having a bicyclic aromatic condensed ring skeleton, multifunctional epoxy compounds having a tricyclic aromatic condensed ring skeleton, and multifunctional epoxy compound having a ring structure other than polycyclic aromatic condensed ring in the skeleton,
the mixture of two or more multifunctional epoxy compounds comprises at least a bifunctional epoxy compound in the form of dihydroxynaphthalene diglycidyl ether,
the curing agent is a cyclic acid anhydride having an acid anhydride moiety constituting a ring structure in the molecule,
the amount of the cyclic acid anhydride is selected in a ratio of 0.7 to 1.1 equivalents with respect to the epoxy equivalent of the epoxy resin component,
wherein said cyclic acid anhydride having an acid anhydride moiety constituting a ring structure in the molecule is a cyclic acid anhydride having another hydrocarbon ring skeleton fused with the ring structure constituted by the acid anhydride moiety, in which
said another hydrocarbon ring skeleton that is fused with the ring structure constituted by the acid anhydride moiety is a structure in which two or more chain-form hydrocarbon groups are substituted on the ring, or a polycyclic structure having a bridge-chains on the ring, and
the total number of carbon atoms composing the structure of said another hydrocarbon ring skeleton including the chain-form hydrocarbon groups is selected in the range of 8 to 18, and
the diluting solvent is a solvent having a high boiling point,
wherein the content ratio of the bifunctional epoxy compound in the form of dihydroxynaphthalene diglycidyl ether to other epoxy compounds is 3:1 in the weight ratio.

2. A conductive adhesive consisting of a conductive medium and a binder resin component,
wherein the conductive medium is metal powder, and the binder resin component is a one-component epoxy thermosetting resin composition,
the conductive adhesive is a dispersion in which the metal powder is dispersed in said one-component epoxy thermosetting resin composition with a content ratio of the metal powder to the binder resin component in terms of volume ratio being selected within a range between 34:66 and 55:45,
the metal powder is silver powder or mixed metal powder comprising silver powder mixed with a small quantity of other metal powder,
the ratio of the silver powder to the entire metal powder is selected to be at least within the range of 70% or more in a volume ratio,
said one-component epoxy thermosetting resin composition is a liquid composition essentially consisting of:
(a) an epoxy resin component,
(b) a curing agent for the epoxy resin component,
(c) a cure accelerator,
(d) an adherence imparting agent, and
(e) a diluting solvent,
wherein the epoxy resin component is a mixture of two or more multifunctional epoxy compounds being selected from a group consisting of bifunctional epoxy compounds and trifunctional epoxy compounds, in which mixture the ratio of the bifunctional epoxy compound to the trifunctional epoxy compound in terms of mole ratio is selected to be within the range between 100:0 and 70:30,
the mixture of two or more multifunctional epoxy compounds is a combination of a multifunctional epoxy compound having a polycyclic aromatic ring skeleton and a multifunctional epoxy compound having a ring structure other than polycyclic aromatic ring in the skeleton, in which combination the mole ratio of the multifunctional epoxy compound having the polycyclic aromatic ring skeleton to the multifunctional epoxy compound having the other ring structure in the skeleton is selected to be within the range between 95:5 and 70:30,
wherein the mixture of two or more multifunctional epoxy compounds consists of two or more multifunctional epoxy compounds selected from a group consisting of multifunctional epoxy compounds having a bicyclic aromatic condensed ring skeleton, multifunctional epoxy compounds having a tricyclic aromatic condensed ring skeleton, and multifunctional epoxy compound having a ring structure other than polycyclic aromatic condensed ring in the skeleton,
the mixture of two or more multifunctional epoxy compounds comprises at least a bifunctional epoxy compound in the form of dihydroxynaphthalene diglycidyl ether,
the curing agent is a cyclic acid anhydride having an acid anhydride moiety constituting a ring structure in the molecule,
the amount of the cyclic acid anhydride is selected in a ratio of 0.7 to 1.1 equivalents with respect to the epoxy equivalent of the epoxy resin component,
wherein said cyclic acid anhydride having an acid anhydride moiety constituting a ring structure in the molecule is a cyclic acid anhydride having another hydrocarbon ring skeleton fused with the ring structure constituted by the acid anhydride moiety, in which
said another hydrocarbon ring skeleton that is fused with the ring structure constituted by the acid anhydride moiety is a structure in which two or more chain-form hydrocarbon groups are substituted on the ring, or a polycyclic structure having a bridge-chain on the ring, and the total number of carbon atoms composing the structure of said another hydrocarbon ring skeleton including the chain-form hydrocarbon groups is selected in the range of 8 to 18, and the diluting solvent is a solvent having a high boiling point, wherein the cure accelerator is an imidazole based cure accelerator, and the amount of the cure accelerator to be added thereto is selected to be within the range of 0.012 to 0.047 moles of the imidazole based cure accelerator molecules per epoxy equivalent of the epoxy resin compound.

3. The conductive adhesive as claimed in claim 2, wherein a silane coupling agent is used as the adherence imparting agent to improve the adherence between the resin and a metal surface, which is used to form junction.

4. The conductive adhesive as claimed in claim 3, wherein the silane coupling agent is selected from γ-glycidoxypropyl-trimethoxy silane or γ-glycidoxypropyl-methyldiethoxy silane.

5. The conductive adhesive as claimed in claim 3, wherein the bifunctional epoxy compound in the form of dyhydroxynaphthalene diglycidyl ether is 1,6-dyhydroxynaphthalene diglycidyl ether.

6. The conductive adhesive as claimed in claim 2, wherein the bifunctional epoxy compound in the form of dihydroxynaphthalene diglycidyl ether is 1,6-dihydroxynaphthalene diglycidyl ether.

7. The conductive adhesive as claimed in claim 2, wherein the content ratio of the bifunctional epoxy compound in the form of dihydroxynaphthalene diglycidyl ether to other epoxy compounds is 3:1 in the weight ratio.

8. The conductive adhesive as claimed in claim 7, wherein the other epoxy compounds is selected from a group consisting of a trihydroxyanthracene triglycidyl ether, a bifunctional epoxy resin having a bisphenol A skeleton and a multifunctional epoxy resin containing a dicyclopentadiene skeleton.

9. The conductive adhesive as claimed in claim 2, wherein the amount of the cyclic acid anhydride is selected in a ratio of 0.8 to 0.95 equivalents with respect to the epoxy equivalent of the epoxy resin component.

10. The conductive adhesive as claimed in claim 2, wherein the metal powder is silver powder or mixed metal powder formed by mixing a small quantity of other metal powder to silver powder, and the ratio of the silver powder to the entire metal powder is selected to be at least within the range of 90% or more in a volume ratio.

11. The conductive adhesive as claimed in claim 2, wherein in the case that said metal powder is mixed metal powder comprising silver powder mixed with a small quantity of other metal powder, said other metal powder that is mixed with silver powder is chosen from copper powder or zinc powder.

12. The conductive adhesive as claimed in claim 2, wherein said multifunctional epoxy compound having other ring structures in the skeleton used in combination is selected from a bifunctional epoxy resin having a bisphenol A skeleton or a multifunctional epoxy resin containing a dicyclopentadiene skeleton.

13. The conductive adhesive as claimed in claim 2, wherein said cyclic acid anhydride is selected from the following terpene-modified maleic anhydrides of Chemical formula 1 or 2:

[Chemical formula 1]

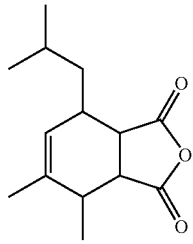

[Chemical formula 2]

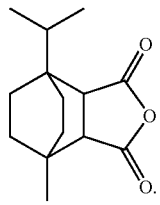

* * * * *